(12) United States Patent
Mehrotra et al.

(10) Patent No.: US 6,686,300 B2
(45) Date of Patent: Feb. 3, 2004

(54) SUB-CRITICAL-DIMENSION INTEGRATED CIRCUIT FEATURES

(75) Inventors: Manoj Mehrotra, Dallas, TX (US); John N. Randall, Richardson, TX (US); Mark S. Rodder, University Park, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/055,262

(22) Filed: Oct. 25, 2001

(65) Prior Publication Data

US 2002/0113277 A1 Aug. 22, 2002

Related U.S. Application Data

(60) Provisional application No. 60/258,891, filed on Dec. 27, 2000.

(51) Int. Cl.[7] ............................................. H01L 21/302
(52) U.S. Cl. ..................... 438/942; 438/945; 438/717; 438/725
(58) Field of Search ................................. 438/142, 151, 438/197, 942, 945, 717, 725; 257/401, 288, 327, 408

(56) References Cited

U.S. PATENT DOCUMENTS

| | | | |
|---|---|---|---|
| 5,644,121 A | * | 7/1997 | Nakano et al. .......... 250/208.1 |
| 6,040,118 A | * | 3/2000 | Capodieci .................... 430/328 |
| 6,184,041 B1 | * | 2/2001 | Furukawa et al. ........... 430/396 |
| 6,218,082 B1 | * | 4/2001 | Yang ........................... 430/325 |
| 2002/0094614 A1 | * | 7/2002 | Maeda et al ................. 438/151 |

* cited by examiner

Primary Examiner—George Eckert
Assistant Examiner—Jose R. Díaz
(74) Attorney, Agent, or Firm—Peter K. McLarty; W. James Brady, III; Frederick J. Telecky, Jr.

(57) ABSTRACT

A method of photolithographically forming an integrated circuit feature, such as a conductive structure, for example a gate electrode (15), or such as a patterned insulator feature, is disclosed. A critical dimension (CD) for a photolithography process defines a minimum line width of photoresist or other masking material that may be patterned by the process. A photomask (20, 30, 40, 50, 60) has a mask feature (25, 35, 45, 55, 65) that has varying width portions along its length. The wider portions have a width ($L_1$) that is at or above the critical dimension of the process, while the narrower portions have a width ($L_2$) that is below the critical dimension of the process. In the case of a patterned etch of a conductor, photoexposure and etching of conductive material using the photomask (20, 30, 40, 50, 60) defines a gate electrode (15) for a transistor (10) that has a higher drive current than a transistor having a uniform gate width at the critical dimension.

13 Claims, 4 Drawing Sheets

SUB-CRITICAL-DIMENSION INTEGRATED CIRCUIT FEATURES

This application claims priority under 35 USC §119(e)(1) of provisional application No. 60/258,891 filed Dec. 27, 2000.

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of integrated circuit manufacture, and is more specifically directed to the photolithographic patterning and etching of elements such as transistor gates and dielectric features in integrated circuits.

A fundamental trend in the field of monolithic integrated circuits is the ever-decreasing reduction of critical feature sizes. Smaller feature sizes, of course, enable the implementation of a higher density of active devices for a given chip area, resulting in greater functionality and lower manufacturing cost. Smaller feature sizes also typically result in improved device performance. In metal-oxide-semiconductor (MOS) integrated circuits, for example, smaller transistor gate widths translate directly to shorter transistor channel lengths. As is well known in the art, shorter transistor channel lengths provide improved gain and drive for MOS transistors.

In MOS technology, one may derive a Figure of Merit (FOM) based upon the inverse relationship of drive current to gate capacitance and to supply voltage:

$$FOM \propto \frac{I_{drive}}{C_{gate} V_d}$$

As such, improvements in the FOM parameter involve increased drive current $I_{drive}$ relative to the device gate capacitance $C_{gate}$ and drain voltage $V_d$. According to conventional technology, an increase in FOM is generally provided by a reduction in gate electrode width and the corresponding transistor channel length.

Of course, a countervailing factor to increasing drive current is an increase in leakage current with decreasing gate width. FIG. 1 illustrates the relationship of drive current $I_{drive}$ to subthreshold (off-state) leakage current $I_{leak}$, for a given device threshold voltage. In some circuit applications, however, one may accept the tradeoff of increased leakage in order to attain the improved drive current. According to conventional techniques, to obtain higher drive current (at a cost of increased leakage current) and move along curve 2 from point $P_1$ to point $P_2$ for a given technology (i.e., process parameters such as gate oxide, etc.), it is typically necessary to reduce the feature size of gate electrode width, or use additional mask steps to provide complex ion implants As is well known in the art, however, the minimum feature size that may be produced in an integrated circuit is limited by the photolithography process. In particular, a minimum patternable feature size is defined, for a given photolithography process, by the smallest width line of photoresist that may be reliably formed after exposure and developing. This size is generally referred to as the critical dimension, or CD. Typically, the CD depends upon the photoresist material used, the planarity of the surface being patterned, and the wavelength of light used to expose the photoresist. If one attempts to pattern a line at a width below the process CD, the line will not be manufacturable due to non-reproducibility, non-uniformity, loss of CD control, missing lines, lack of process margin, and the like.

Other techniques for improving drive current for a given technology and photolithography CD are also known. One way is to perform a masked threshold adjust implant into the channel region of the device, reducing the threshold voltage in surface channel MOS devices. Another approach is to perform masked lightly-doped drain implants to provide implants of varying energies, further tailoring the effective channel length. As evident from this description, these alternative approaches involve at least one additional photolithography step (two in the case of CMOS), adding process cost and process complexity.

Similar concerns are also present in the formation of small insulator features in integrated circuits. As known in the art, small features of silicon dioxide, silicon nitride, and the like are often useful at various stages in the process. For example, patterned insulator films are used to define active regions ("inverse moat" locations) of the integrated circuit. A patterned insulator film may also be used, instead of photoresist, as a hard mask layer, in which case the feature size of the patterned insulator film may become critical. Further, in many modem processes, a so-called "damascene" approach is used to define conductors; this technique involves the patterned etch of an insulator film to form openings into which the conductor layer is then deposited, effectively inlaying the conductor into the desired pattern.

BRIEF SUMMARY OF THE INVENTION

It is therefore an object of the present invention to provide a transistor having improved drive current for a given technology critical dimension feature size.

It is a further object of the present invention to provide a method of forming such a transistor without requiring a change in the photolithography process other than a mask change.

It is a further object of the present invention to provide such a transistor and method with minimal added manufacturing cost.

Other objects and advantages of the present invention will be apparent to those of ordinary skill in the art having reference to the following specification together with its drawings.

The present invention may be implemented by the photolithographic patterning of a layer of photoresist, for example for patterning a critical dimension such as transistor gates. The patterning is performed with a mask having a pattern with varying line widths. At selected positions along the pattern, the line width is at or above the critical dimension; at locations between these positions, the line width is below the critical dimension. The ratio and periodicity of critical dimension to sub-critical dimension widths is selected to be sufficient that the portions of patterned photoresist at the critical dimension support the interleaved portions at below the critical dimension. When applied to the patterning of conductive gate material, the resulting device, in MOS technology, provides improved drive current by providing an effectively shorter channel length, for a given photolithography process.

DETAILED DESCRIPTION OF THE INVENTION

The present invention will now be described by way of example, according to its preferred embodiments. It is contemplated that the present invention may be used in alternative implementations, such as in forming integrated circuit features other than transistor gate structures, while still obtaining the benefits of the present invention. For example, it is contemplated that the present invention may be used to form bipolar transistor features, and conductor lines in general. It is contemplated that those skilled in the art having reference to this specification will be readily able to implement the present invention in these and other ways, and that such implementations are within the scope of the invention as claimed.

Figure 2:
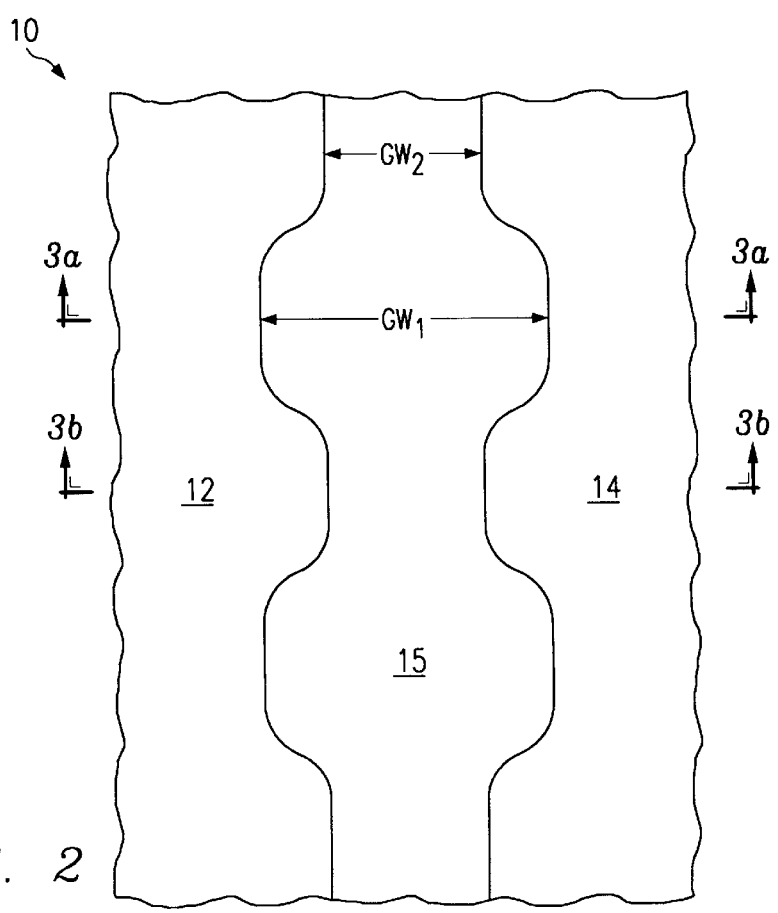
FIG. 2 is a plan view of an MOS transistor constructed according to a first preferred embodiment of the present invention.
Figure 3A:
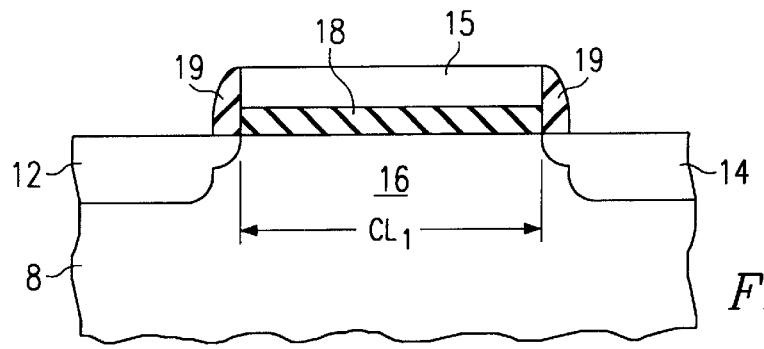
FIGS. 3a and 3b are cross-sectional views of the MOS transistor of FIG. 2 at selected locations, according to the first preferred embodiment of the present invention.
Figure 3B:
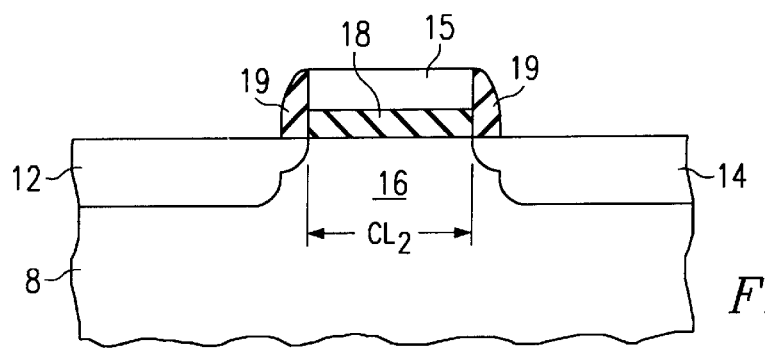

FIG. 2 illustrates, in plan view, MOS transistor 10 according to a first preferred embodiment of the invention; transistor 10 is shown in cross-section in FIGS. 3a and 3b. Transistor 10 includes source region 12 and drain region 14, which are diffused regions (having lightly-doped drain extensions in this example) formed into substrate 8 as shown in FIGS. 3a and 3b. Of course, source and drain regions 12, 14 are of opposite conductivity type from that of substrate 8. Alternatively, source and drain region 12, 14 may be diffused into a well region of opposite conductivity type, for example as used in conventional complementary MOS (CMOS) technology. Gate electrode 15 overlies body region 16 disposed between source and drain regions 12, 14, and is separated by body region by gate dielectric 18.

In transistor 10, source and drain regions 12, 14 are formed in a self-aligned manner, after the formation of gate electrode 15. In this example, as is well known in the art, a first light ion implant of dopant species is performed after formation of gate electrode 15 (over gate dielectric 18), to form the lightly-doped drain extensions in a self-aligned manner relative to the edges of gate electrode 15 itself. Sidewall insulator filaments 19 are then formed along the edges of gate electrode 15 by conformal deposition of the insulator material, followed by an anisotropic etch to leave filaments 19. A heavier dose ion implant is then performed to complete the formation of source and drain regions 12, 14, in a manner self-aligned with filaments 19 along the sides of gate electrode 15.

As evident from FIG. 2, gate electrode 15 has a width that varies, along its length, between a wider gate width $GW_1$ and a narrower gate width $GW_2$. The transition between the wider and narrower gate widths $GW_1$, $GW_2$ is relatively smooth. As shown in FIG. 3a, the wider gate width $GW_1$ results in a corresponding transistor channel length $CL_1$; FIG. 3b illustrates that the narrower gate width $GW_2$ provides a correspondingly narrower transistor channel length $CL_2$.

Gate electrode 15 is formed by the conventional photolithography and etching of gate material, such as polysilicon, using a photomask having varying feature widths. Alternative gate materials, such as refractory metals and refractory metal silicides, may alternatively be used. According to this first preferred embodiment of the invention, wider gate width $GW_1$ is defined by a photomask feature at the critical dimension (CD) of the photolithography process. The CD is the minimum feature size that may be reliably patterned by the process, regardless of feature shape. In other words, the CD of a process is the minimum width photoresist line that may be patterned with that process. Also according to this first preferred embodiment of the invention, narrower gate width $GW_2$ is formed by a photomask feature to a width that is narrower than the CD of the process.

Figure 4:
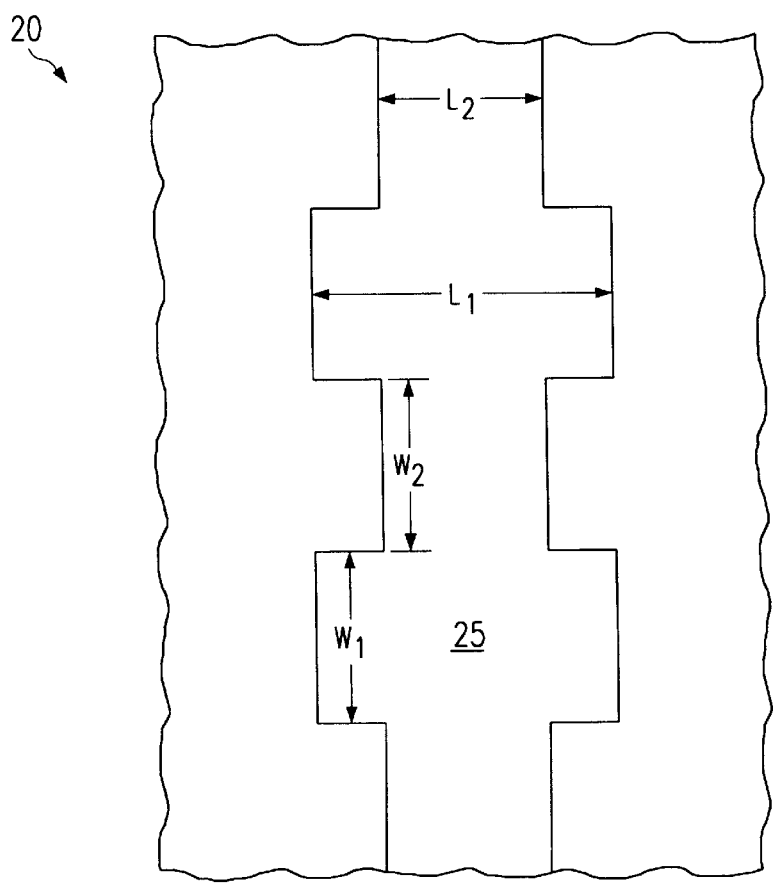
FIG. 4 is a plan view of a photomask used to form the gate conductor of the transistor, according to the first preferred embodiment of the present invention.

FIG. 4 illustrates photomask 20 for patterning gate electrode 15 according to this first preferred embodiment of the invention. Photomask 20 in this example is provided for use in connection with positive photoresist, in that photomask 20 protects from exposure those locations of photoresist that are to remain as a mask, and exposes photoresist to be removed. The embodiments of the present invention may alternatively be applied to negative photoresist, where photoresist that is to remain as a mask is exposed; in this case, of course, the photomask would be the reverse of that shown in FIG. 4. According to this embodiment of the invention, feature 25 of photomask 20 defines gate electrode 15 of transistor 10, and is opaque to light of the wavelength used in the photolithography process; the remainder of photomask 20 is transparent to this light.

As shown in FIG. 4, feature 25 includes alternating portions of width $L_1$, $L_2$ along its length. These gate widths $L_1$, $L_2$ result in corresponding gate widths $GW_1$, $GW_2$ in gate electrode 15, and thus in corresponding transistor channel lengths $CL_1$, $CL_2$; these dimensions L, GW, CL will generally not equal one another, but will vary from one another according to such factors as mask oversize to account for polysilicon underetch, and the lateral diffusion of source and drain regions 12, 14. According to the present invention, the larger width $L_1$ corresponds to the critical dimension (CD) of the photolithography process being used to pattern gate electrode 15. As described above, the CD of a given process is the smallest feature size that can be reliably patterned, regardless of feature shape, for a given photolithography process; typically, the CD is the width of the narrowest line that can be patterned. Also in feature 25, the smaller width $L_2$ is a feature size that is smaller than the CD. For example, in a photolithography process having a $0.25\mu$ CD, width $L_1$ of feature 25 will be $0.25\mu$, while width $L_2$ will be smaller, for example about $0.20\mu$; these widths $L_1$, $L_2$ will depend upon the pitch of these features along the length of feature 25.

As noted above and as shown in FIG. 4, the portions of feature 25 of widths $L_1$, $L_2$ alternate with one another along the length of feature 25. In this example, each portion of width $L_1$ extends along feature 25 for a distance $W_1$, and each portion of width $L_2$ extends along feature 25 for a distance $W_2$. According to the present invention, the distance $W_1$ of each $L_1$ width portion of feature 25 is sufficiently long to reliably pattern a photoresist feature; for example, distance $W_1$ should be at least the CD of the process. Each portion of feature 25 having width $L_2$ is disposed between two portions of width $L_1$, with the edges of feature 25 between each portion being substantially perpendicular to the running length of feature 25. Even though width $L_2$ is below the process CD, its location between portions that are at or above the CD permits the photoresist at that location to be "supported" by the $L_1$ width portions of feature 25, so long as distance $W_2$ is not overly long. For example, it is contemplated that distance $W_2$ should not be more than two to three times that of distance $W_1$, depending upon the particular photoresist characteristics of adhesion and the like On the other hand, as will become apparent from the following description, the drive performance of the resulting transistor increases, as distance $W_2$ increases relative to distance $W_1$.

It is contemplated that photomask 20 will typically be a reticle, and typically magnified from the pattern to be applied to the semiconductor wafer on which the integrated circuits are being formed. For example, the actual size of feature 25 may be four to ten times the size of the features patterned on the actual wafer. This facilitates the manufacture of photomask 25 by conventional photolithography techniques used to fabricate photomasks, even though with $L_2$ is less than the photolithography CD.

Photomask 20 is used to mask the photoexposure of substrate 8 (FIGS. 3a and 3b) after the deposition of a polysilicon layer, in this example, from which gate electrode 15 is to be formed. A layer of photoresist is applied over the deposited polysilicon, and is exposed to light of the selected wavelength, masked by photomask 25. Following exposure and conventional development, a photoresist feature remains at the location at which gate electrode 15 is to be formed. This developed photoresist then masks the etching of the polysilicon layer, defining gate electrode 15 accordingly.

As shown in FIG. 4, feature 25 of photomask 20 has relatively sharp transitions and corners between the $L_1$ and $L_2$ width portions. Because of light spreading, and partially isotropic nature of developing and other resist processing, these sharp corners will not necessarily appear in the resulting photoresist pattern. Indeed, it is contemplated that some smoothing of the resist pattern will occur, as indicated by the relatively smooth transitions in eventual gate electrode 15 as shown in FIG. 2.

Given these smooth transitions, the sub-CD feature width $L_2$ of photomask 20 effectively forms a "sag" in the photoresist at this location, given that width $L_2$ cannot be directly patterned. This sag is attached to, and supported by, the portions of photoresist masked by the $L_1$ width portions of feature 25, which serve as "pegs" in this resist line. If these pegs were not present, no line could be patterned reliably and reproducibly, considering that width $L_2$ is below the CD of the process.

Figure 6:
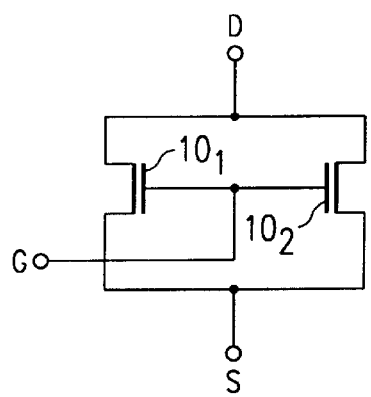
FIG. 6 is an electrical diagram, in schematic form, of an equivalent electrical model for a transistor formed according to the preferred embodiments of the invention.

Following the exposure and patterning of photoresist, the polysilicon layer is etched to form gate electrode 15 as shown in FIGS. 2, 3a, and 3b. The resulting transistor 10, after the formation of source and drain regions 12, 14, thus has two effective channel lengths $CL_1$, $CL_2$. The electrical performance of transistor 10 can be modeled by two parallel transistors, of different channel length, but with commonly connected gates, drains, and sources. FIG. 6 illustrates such a model, in which transistor 101 and transistor 102, having channel lengths $CL_1$, $CL_2$, are connected in parallel. In this example, of course, channel length $CL_2$ is smaller than channel length $CL_1$, and thus provides higher drive at lower voltages. Additionally, the effective threshold voltages at which these two parallel transistors switch on are different, with transistor 102 switching on first. This behavior produces the drive characteristic that will now be described relative to FIG. 7.

Figure 7:
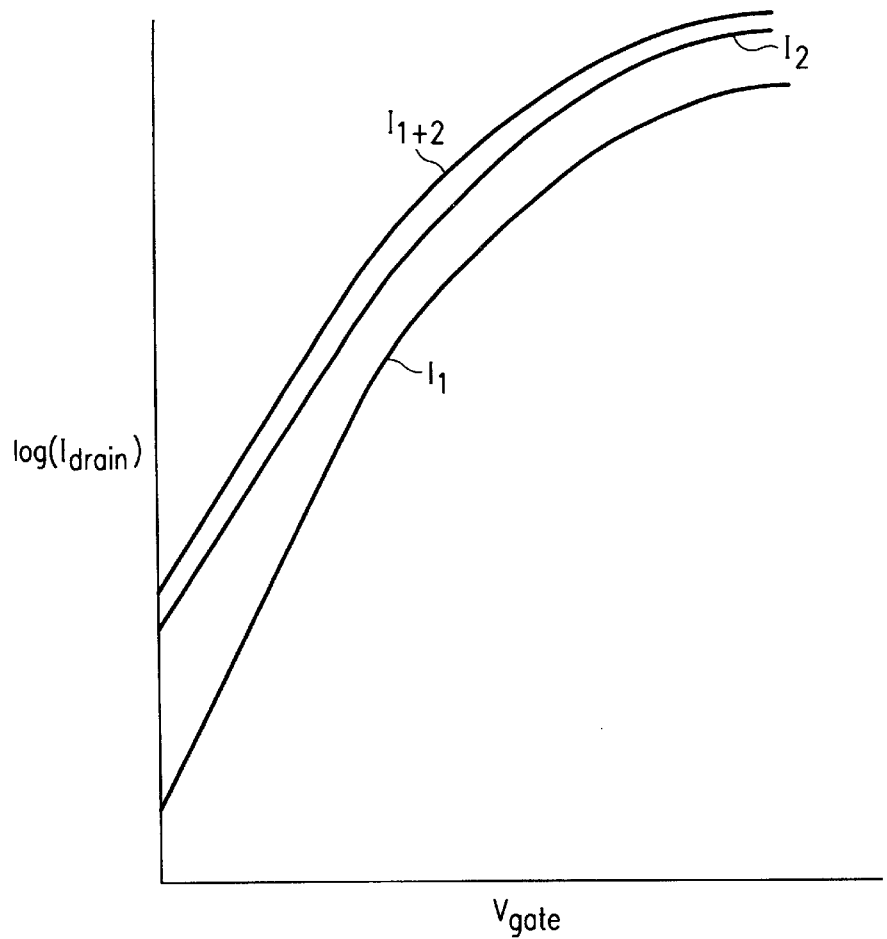
FIG. 7 is a plot of current versus voltage for a transistor formed according to the preferred embodiments of the invention.

FIG. 7 illustrates the current-voltage characteristic for transistor 10 according to this preferred embodiment of the invention. As shown in FIG. 7, and consistent with the model of FIG. 6, at lower gate voltages $V_G$ (drain voltage being constant), the drain current $I_D$ is dominated by conduction through the shorter channel length transistor 102, as shown by the plot portion $I_2$ of FIG. 7. At higher gate voltage $V_G$, conduction passes through both regions of transistor 10, modeled by conduction through transistors 102 and 101 of FIG. 6. This parallel conduction is illustrated by plot portion $I_{1+2}$ of FIG. 7. Typically, the transition region at the switching on voltage of the longer channel length portion of transistor 10 is relatively smooth. In general, therefore, the overall drive current of transistor 10 according to this embodiment of the invention is higher than that which would be provided by a transistor having a uniform gate width at the process CD.

Figure 1:
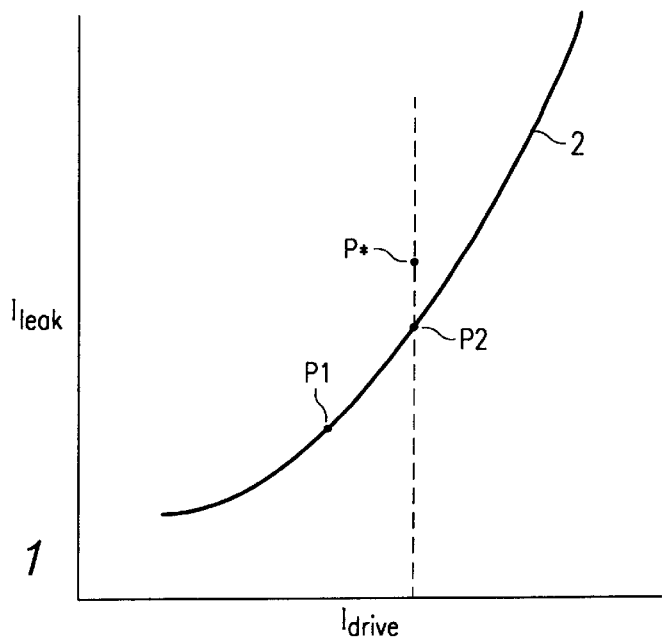
FIG. 1 is a plot of drive current versus leakage current for metal-oxide-semiconductor (MOS) transistors.

Referring back to FIG. 1, this improved drive current provided by transistor 10 according to this first preferred embodiment can be further explained. In FIG. 1, point $P_1$ corresponds to a conventional MOS transistor, having a uniform gate width at the CD of the corresponding photolithography process. As discussed above, to move the drive current from point $P_1$ to point $P_2$ according to conventional techniques requires the formation of smaller gate width and channel length devices, or the use of additional masked implants; if point $P_1$ corresponds to an MOS device having a gate width that is already at the CD for the process, and if additional masked implants are to be avoided, a reduction in the process CD is necessary to attain the drive characteristics shown at point $P_2$.

According to this preferred embodiment of the invention, however, transistor 10 can be formed to have the drive characteristics shown at point P* in FIG. 1. This improved drive current at point P* may be achieved at the same CD as point $P_1$. Of course, transistor 10 has portions of its channel with a reduced channel length $CL_2$ due to the portions of photomask feature 25 having a width $L_2$ that is shorter than the process CD. Accordingly, improved drive capability is enabled by the present invention.

Furthermore, improvement in the transistor Figure of Merit (FOM) is provided by the present invention. As noted above, a commonly used FOM corresponds to the relation:

$$FOM \propto \frac{I_{drive}}{C_{gate}V_d}$$

where $I_{drive}$ is the drive current provided by the device, where $C_{gate}$ is the gate capacitance of the device, and where $V_d$ is the transistor supply voltage. Transistor 10 according to this first preferred embodiment of the invention provides improved drive current $I_{drive}$ relative to a transistor of uniform gate width at the CD for the process, as noted above. In addition, it is also contemplated that transistor 10 will have slightly lower gate capacitance $C_{gate}$ than a corresponding transistor of uniform gate width at the same CD for the process, because of the smaller gate area of transistor 10. It is therefore contemplated that the FOM for transistor 10 will be significantly improved relative to a uniform gate width CD transistor using the same technology.

These benefits of improved drive current, as well as increased transistor FOM, are obtained according to the present invention in a manner that is fully consistent with current manufacturing processes. This is due to the implementation of the improvement into the photomask, by the provision of sub-CD features; however, no change is contemplated to be necessary to the photolithography process in order to obtain these benefits.

Referring now to FIGS. 5a through 5d, various alternative photomasks useful in connection with the present invention will now be described. These alternative photomasks may be used in the same integrated circuit as contain transistors of the other gate shapes, including transistors formed according to photomask 20 and also uniform gate length devices.

Figure 5A:
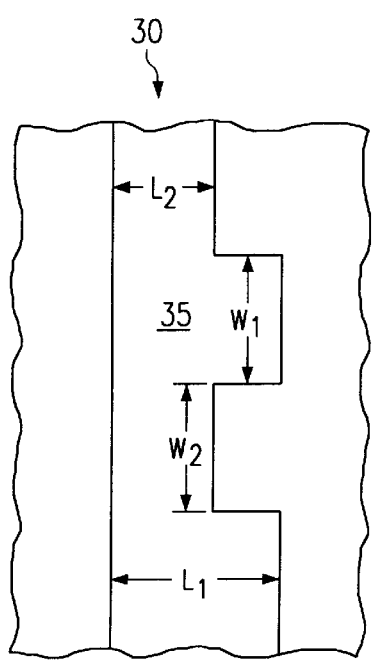
FIGS. 5a through 5d are plan views of photomasks according to alternative preferred embodiments of the present invention.

FIG. 5a illustrates photomask 30 according to a second embodiment of the invention, in which the variations in feature width $L_1$, $L_2$ are provided by feature 35. In this alternative embodiment of the invention, one side of feature 35 follows a straight line, with the opposing side of the feature is toothed to provide the alternating portions of width $L_1$, $L_2$. This arrangement of feature 35 may be useful in order to remain within design rules, for example if a neighboring unrelated feature is close to the straight side of feature 35.

Figure 5B:
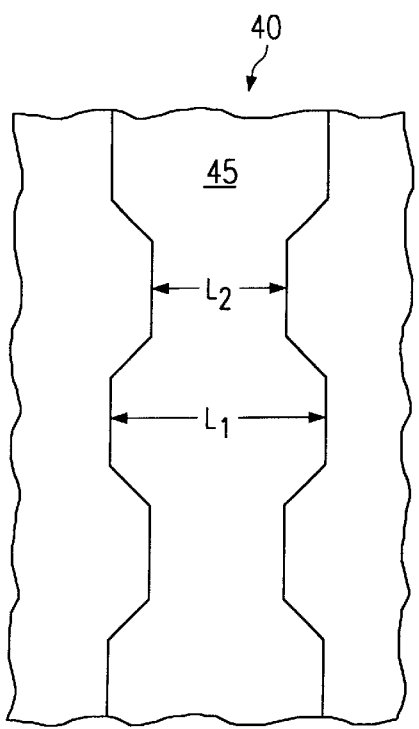
Figure 5C:
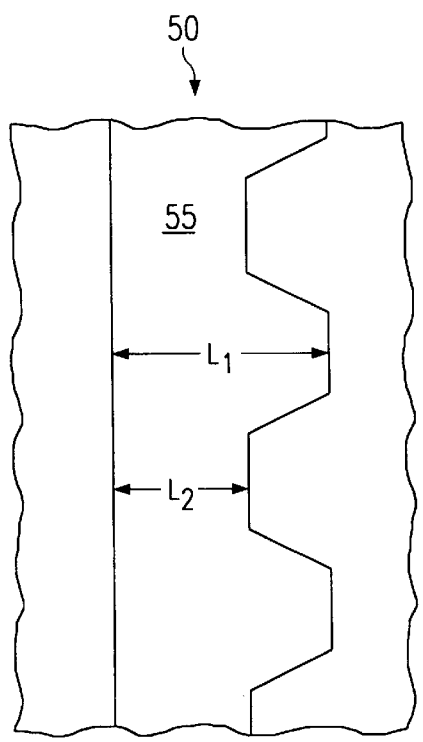

FIG. 5b illustrates photomask 40 according to another embodiment of the invention. Feature 45 of photomask 40 has sloped transitions between the portions of width $L_1$, $L_2$, rather than abrupt transitions. It is contemplated that these sloped transitions will assist in the smooth transition of the patterned photoresist using photomask 40, improving the reliability of the patterned line. FIG. 5c illustrates photomask 50 with feature 55, in which the sloped transitions between portions of widths $L_1$, $L_2$ as in photomask 40 are used in connection with a straight-edged feature 55, similar to that of photomask 30 discussed above.

Figure 5D:
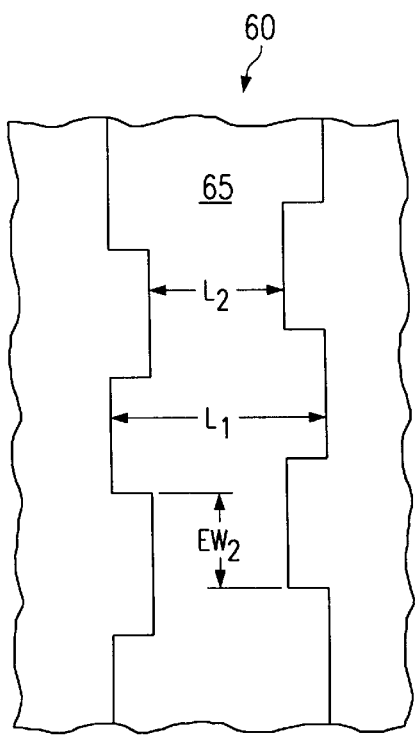

According to another preferred embodiment of the invention, photomask 60 includes feature 65 with staggered sub-CD portions. As shown in FIG. 5d, the toothed edges of feature 65 that define the sub-CD gate width $L_2$ are staggered from one another, so that the narrower $L_2$ portions of the eventual gate are not patternable to the full width $W_2$, but instead are patterned to a reduced effective width $EW_2$ as shown in FIG. 5d. This reduction provides further reliability in the patterning of the eventual gate electrode, while maintaining control of the photolithography process.

As made evident from each of these embodiments of the invention, higher drive transistors may be fabricated, without requiring changes in the photolithography process to reduce the critical dimension of the process. As such, it is contemplated that the transistors formed according to the present invention will be particularly useful in applications that require maximum switching speed.

The preferred embodiments of the invention are described above relative to several preferred embodiments, specifically relative to conventional MOS transistors formed in bulk. It is of course contemplated that the present invention may be used to advantage in many alternative applications, including MOS transistors in silicon-on-insulator technology, for forming gates of other field-effect devices, and for forming other features in integrated circuits.

An important alternative embodiment of the present invention is the formation of patterned insulator features of sizes below the CD of the photolithography process. Examples of insulator films that may be patterned according to the present invention include silicon dioxide, silicon nitride, and the like, as well as multiple layer stacks of such films. Insulator films may be patterned at various stages of the overall manufacturing process. One important use of a patterned insulator film is in the definition of the active regions of the device. A patterned insulator film may also be used as a hard mask layer for the etching of an underlying conductor or other film. In addition, an insulator layer may be patterned and etched to form openings into which a conductive material is then deposited to form conductor lines, in the so-called "damascene" process. It is contemplated that the present invention may be readily applied to the patterned etch of insulator films in these, and other, stages of the manufacturing of integrated circuits.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A method of forming a patterned structure in an integrated circuit at a semiconductor surface of a substrate, comprising the steps of:

forming a first layer over the surface;

applying a layer of photosensitive masking material over the first layer;

exposing the photosensitive masking material to light through a photomask having an elongated feature, the feature having a plurality of first sections along its length of a width at or greater than a critical photolithographic dimension, and having at least one second section disposed between adjacent ones of the first sections of the feature, the at least one second section having a width less than the critical photolithographic dimension;

after the exposing step, removing the photosensitive masking material from locations not corresponding to the location at which the patterned structure is to be formed; and etching the first layer to form the patterned structure.

2. The method of claim 1, wherein the critical photolithographic dimension corresponds to a minimum line width that may be defined by the exposing and removing of the photosensitive masking material.

3. The method of claim 1, wherein the first layer comprises a conductive material.

4. The method of claim 3, further comprising:

after the etching step, doping locations of the surface adjacent the patterned structure.

5. The method of claim 1, wherein the first layer comprises an insulator material.

6. The method of claim 5, further comprising:

after the etching step, depositing a second layer overall, the second layer comprising a conductive material and extending into the etched portions of the first layer.

7. The method of claim 1, wherein each of the plurality of first sections extends for a selected length along the feature;

and wherein the at least one second section extends for a length along the feature that is less than about three times the selected length of the plurality of first sections.

8. The method of claim 1, wherein the at least one second section and its adjacent ones of the plurality of first sections have sides that are substantially parallel to the length of the elongated feature;

and wherein the elongated feature has edges, between the at least one second section and its adjacent ones of the plurality of first sections, that are substantially perpendicular to the sides of the at least one second section and its adjacent ones of the plurality of first sections.

9. The method of claim 8, wherein the elongated feature has a side that defines substantially a straight line segment.

10. The method of claim 1, wherein the at least one second section and its adjacent ones of the plurality of first sections have sides that are substantially parallel to the length of the elongated feature;

wherein the sides of the at least one second section and its adjacent ones of the plurality of first sections are separated by sloping portions of the elongated feature.

11. The method of claim 10, wherein the elongated feature has a side that defines substantially a straight line segment.

12. The method of claim 1, wherein the at least one second section and its adjacent ones of the plurality of first sections have sides that are substantially parallel to the length of the elongated feature;

and wherein opposing sides of the at least one second section and its adjacent ones of the plurality of first sections are substantially aligned with one another.

13. The method of claim 1, wherein the at least one second section and its adjacent ones of the plurality of first sections have sides that are substantially parallel to the length of the elongated feature;

and wherein opposing sides of the at least one second section and its adjacent ones of the plurality of first sections are staggered relative to one another.

* * * * *